US012796172B2

(12) United States Patent
Shin et al.

(10) Patent No.: US 12,796,172 B2
(45) Date of Patent: Nov. 10, 2026

(54) NITRIDE-BASED SEMICONDUCTOR LIGHT-EMITTING DEVICE

(71) Applicant: SAMSUNG DISPLAY CO., LTD., Yongin-si (KR)

(72) Inventors: Dongchul Shin, Suwon-si (KR); Joosung Kim, Suwon-si (KR); Younghwan Park, Suwon-si (KR); Junhee Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 388 days.

(21) Appl. No.: 18/534,264

(22) Filed: Dec. 8, 2023

(65) Prior Publication Data

US 2024/0234629 A1 Jul. 11, 2024

Related U.S. Application Data

(63) Continuation-in-part of application No. 18/224,255, filed on Jul. 20, 2023.

(30) Foreign Application Priority Data

Jan. 5, 2023 (KR) ........................ 10-2023-0001921
Nov. 23, 2023 (KR) ........................ 10-2023-0164550

(51) Int. Cl.
*H10H 20/815* (2025.01)
*H10H 20/812* (2025.01)
(Continued)

(52) U.S. Cl.
CPC ........ *H10H 20/815* (2025.01); *H10H 20/812* (2025.01); *H10H 20/819* (2025.01); *H10H 20/825* (2025.01)

(58) Field of Classification Search
CPC .. H10H 20/815; H10H 20/812; H10H 20/825; H10H 20/819; H10H 20/821; H10H 20/8215; H10H 29/142; H10W 90/00
See application file for complete search history.

(56) References Cited

U.S. PATENT DOCUMENTS 8,728,841 B2 5/2014 Oh et al.
8,994,052 B2 3/2015 Shen et al.
(Continued)

FOREIGN PATENT DOCUMENTS

EP 2348548 A2 7/2011
EP 3217441 B1 7/2019
(Continued)

OTHER PUBLICATIONS

Bulashevich et al., "Impact of surface recombination on efficiency of III-nitride light-emitting diodes", Phys. Status Solidi RRL, 2016, vol. 10, No. 6, pp. 480-484 (5 pages total).
(Continued)

*Primary Examiner* — Mark W Tornow
(74) *Attorney, Agent, or Firm* — Sughrue Mion, PLLC

(57) ABSTRACT

A nitride-based semiconductor light-emitting device, including a first semiconductor layer, wherein the first semiconductor layer is nitride-based and has a first conductivity type; a light-emitting layer provided on the first semiconductor layer, wherein the light-emitting layer may include a nitride-based semiconductor including Indium (In); a second semiconductor layer provided on the light-emitting layer, wherein the second semiconductor layer is nitride-based and has a second conductivity type; and a strain relaxation layer provided between the first semiconductor layer and the light-emitting layer, and including an AlGaN layer having a protrusion whose horizontal cross-section area decreases as
(Continued)

the protrusion extends in a vertical direction from the second semiconductor layer to the first semiconductor layer.

20 Claims, 10 Drawing Sheets

(51) Int. Cl.
*H10H 20/819* (2025.01)
*H10H 20/825* (2025.01)

(56) References Cited

U.S. PATENT DOCUMENTS

| | | | | |
|---|---|---|---|---|
| 9,029,832 | B2 * | 5/2015 | Okuno | H10H 20/81 257/15 |
| 9,090,993 | B2 | 7/2015 | Miyoshi et al. | |
| 9,112,105 | B1 | 8/2015 | Yang et al. | |
| 9,397,257 | B2 | 7/2016 | Park et al. | |
| 2010/0099213 | A1 * | 4/2010 | Wu | H10P 14/3402 438/46 |
| 2011/0140083 | A1 * | 6/2011 | Driscoll | H10P 14/2901 257/15 |
| 2018/0138332 | A1 | 5/2018 | Du et al. | |
| 2020/0075798 | A1 * | 3/2020 | Sokol | H10H 20/811 |
| 2022/0310796 | A1 * | 9/2022 | Zhang | H10D 62/124 |
| 2024/0234628 | A1 * | 7/2024 | Shin | H10H 20/815 |

FOREIGN PATENT DOCUMENTS

| | | | |
|---|---|---|---|
| KR | 10-1497082 | B1 | 3/2015 |
| KR | 10-2017-0077506 | A | 7/2017 |
| KR | 10-2075987 | B1 | 2/2020 |
| KR | 10-2249647 | B1 | 5/2021 |

OTHER PUBLICATIONS

Extended European Search Report dated May 14, 2024, issued by the European Patent Office in European Application No. 23215804.8.

* cited by examiner

NITRIDE-BASED SEMICONDUCTOR LIGHT-EMITTING DEVICE

CROSS-REFERENCE TO RELATED APPLICATIONS

This is a continuation-in-part of U.S. application Ser. No. 18/224,255 filed Jul. 20, 2023, which is based on and claims priority under 35 U.S.C. § 119 to Korean Patent Application Nos. 10-2023-0001921, filed on Jan. 5, 2023, and 10-2023-0164550, filed on Nov. 23, 2023, in the Korean Intellectual Property Office, the disclosure of which is incorporated by reference herein in its entirety.

BACKGROUND

1. Field

The disclosure relates to a nitride-based semiconductor light-emitting device.

2. Description of the Related Art

Crystal defects may be generated in a nitride-based semiconductor formed on a growth substrate, and heat energy rather than light energy may be emitted through the crystal defects when electrons and holes are coupled together. Such crystal defects may occur due to a mismatch in lattice constants or a difference in thermal expansion coefficients between a growth substrate and a nitride-based semiconductor grown thereon. An indium (In) composition in an InGaN layer that is a light-emitting layer may be increased in GaN-based semiconductors to implement a long wavelength. However, a mismatch in lattice constants may increase with the increase in the In composition, which may increase defects in the light-emitting layer, thereby reducing the light emitting efficiency.

SUMMARY

Provided is a nitride-based semiconductor light-emitting device.

Additional aspects will be set forth in part in the description which follows and, in part, will be apparent from the description, or may be learned by practice of the presented embodiments of the disclosure.

In accordance with an aspect of the disclosure, a nitride-based semiconductor light-emitting device includes a first semiconductor layer, wherein the first semiconductor layer is nitride-based and has a first conductivity type; a light-emitting layer provided on the first semiconductor layer, wherein the light-emitting layer may include a nitride-based semiconductor including Indium (In); a second semiconductor layer provided on the light-emitting layer, wherein the second semiconductor layer is nitride-based and has a second conductivity type; and a strain relaxation layer provided between the first semiconductor layer and the light-emitting layer, and including an AlGaN layer having a protrusion whose horizontal cross-section area decreases as the protrusion extends in a vertical direction from the second semiconductor layer to the first semiconductor layer.

Each of the first semiconductor layer and the second semiconductor layer may include a GaN layer.

The first semiconductor layer may include an n-type GaN layer, and the second semiconductor layer may include a p-type GaN layer.

The light-emitting layer may include a multi-quantum well (MQW) structure including a first plurality of InGaN layers.

A first plurality of GaN layers may be provided between the first plurality of InGaN layers.

The strain relaxation layer may include a superlattice buffer layer.

The superlattice buffer layer may include a structure including a second plurality of InGaN layers stacked alternatingly with a second plurality of GaN layers stacked alternately.

The AlGaN layer may be provided in the superlattice buffer layer.

The AlGaN layer may be located above a minimum thickness of the superlattice buffer layer at which strain relaxation occurs.

V-shaped pits generated in a strain relaxation process may be formed at a location of the AlGaN layer in the superlattice buffer layer, and the AlGaN layer may be formed to fill the V-shaped pits.

The AlGaN layer may be configured to suppress propagation of dislocations from the V-shaped pits toward the light-emitting layer.

The AlGaN layer may be provided at least one of on the superlattice buffer layer and under the superlattice buffer layer.

The AlGaN layer may be further provided in the superlattice buffer layer.

In accordance with an aspect of the disclosure, a display device includes a display, wherein the display includes: a first semiconductor layer, wherein the first semiconductor layer is nitride-based and has a first conductivity type; a light-emitting layer provided on the first semiconductor layer, wherein the light-emitting layer may include a nitride-based semiconductor including Indium (In); a second semiconductor layer provided on the light-emitting layer, wherein the second semiconductor layer is nitride-based and has a second conductivity type; and a strain relaxation layer provided between the first semiconductor layer and the light-emitting layer, and including an AlGaN layer having a protrusion whose horizontal cross-section area decreases as the protrusion extends in a vertical direction from the second semiconductor layer to the first semiconductor layer.

In accordance with an aspect of the disclosure, a nitride-based semiconductor light-emitting device includes a first semiconductor layer, wherein the first semiconductor layer is nitride-based and has a first conductivity type; a light-emitting layer provided on the first semiconductor layer, wherein the light-emitting layer may include a nitride-based semiconductor including Indium (In); a second semiconductor layer provided on the light-emitting layer, wherein the second semiconductor layer is nitride-based and has a second conductivity type; and a strain relaxation layer provided between the first semiconductor layer and the light-emitting layer, and including an AlGaN layer having a protrusion whose horizontal cross-section area decreases as the protrusion extends in a first vertical direction from the second semiconductor layer to the first semiconductor layer, and in a second vertical direction from the first semiconductor layer to the second semiconductor layer.

Each of the first semiconductor layer and the second semiconductor layer may include a GaN layers.

The light-emitting layer may include a multi-quantum well (MQW) structure including a first plurality of InGaN layers stacked alternatingly with a first plurality of GaN layers.

The strain relaxation layer may include a superlattice buffer layer.

The superlattice buffer layer may include a structure including a second plurality of InGaN layers stacked alternatingly with a second plurality of GaN layers.

The AlGaN layer is provided in the superlattice buffer layer and is located above a minimum thickness of the superlattice buffer layer at which strain relaxation occurs.

In accordance with an aspect of the disclosure, a nitride-based semiconductor light-emitting device includes a first semiconductor layer, wherein the first semiconductor layer is nitride-based and has a first conductivity type; a light-emitting layer provided on the first semiconductor layer, wherein the light-emitting layer comprises a nitride-based semiconductor comprising Indium (In); a second semiconductor layer provided on the light-emitting layer, wherein the second semiconductor layer is nitride-based and has a second conductivity type; and a strain relaxation layer provided between the first semiconductor layer and the light-emitting layer, wherein the strain relaxation layer comprises a superlattice buffer layer having a structure including a plurality of InGaN layers stacked alternatingly with a plurality of GaN layers stacked alternately, and an AlN layer and an AlGaN layer having a protrusion whose horizontal cross-section area decreases as the protrusion extends in a vertical direction from the second semiconductor layer to the first semiconductor layer.

The AlN layer and the AlGaN layer may be provided in the superlattice buffer layer.

The AlN layer and the AlGaN layer may be located above a minimum thickness of the superlattice buffer layer at which strain relaxation occurs.

In accordance with an aspect of the disclosure, a display device includes a display, wherein the display includes a first semiconductor layer, wherein the first semiconductor layer is nitride-based and has a first conductivity type; a light-emitting layer provided on the first semiconductor layer, wherein the light-emitting layer comprises a nitride-based semiconductor comprising Indium (In); a second semiconductor layer provided on the light-emitting layer, wherein the second semiconductor layer is nitride-based and has a second conductivity type; and a strain relaxation layer provided between the first semiconductor layer and the light-emitting layer, wherein the strain relaxation layer comprises a superlattice buffer layer having a structure including a plurality of InGaN layers stacked alternatingly with a plurality of GaN layers stacked alternately, and an AlN layer and an AlGaN layer having a protrusion whose horizontal cross-section area decreases as the protrusion extends in a vertical direction from the second semiconductor layer to the first semiconductor layer.

In accordance with an aspect of the disclosure, a nitride-based semiconductor light-emitting device includes a first semiconductor layer, wherein the first semiconductor layer is nitride-based and has a first conductivity type; a light-emitting layer provided on the first semiconductor layer, wherein the light-emitting layer comprises a nitride-based semiconductor comprising Indium (In); a second semiconductor layer provided on the light-emitting layer, wherein the second semiconductor layer is nitride-based and has a second conductivity type; and a strain relaxation layer provided between the first semiconductor layer and the light-emitting layer, wherein the strain relaxation layer comprises a superlattice buffer layer having a structure including a plurality of InGaN layers stacked alternatingly with a plurality of GaN layers stacked alternately, and an AlN layer and an AlGaN layer having a protrusion whose horizontal cross-section area decreases as the protrusion extends in a first vertical direction from the second semiconductor layer to the first semiconductor layer, and in a second vertical direction from the first semiconductor layer to the second semiconductor layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
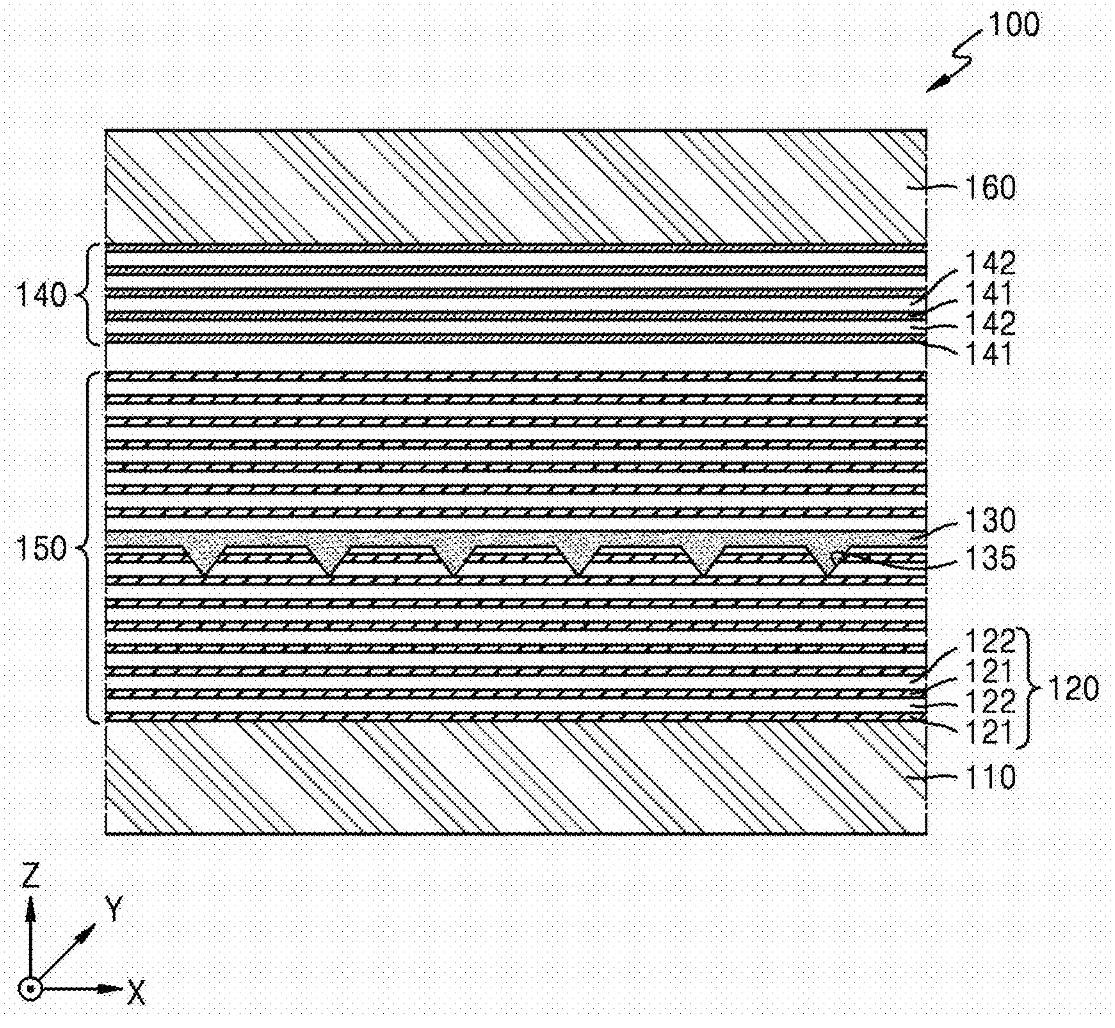
FIG. 1 schematically illustrates a cross-section of a nitride-based semiconductor light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, various embodiments disclosed herein are described in detail with reference to the accompanying drawings. In the drawings, like reference numerals denote like components, and sizes of components in the drawings may be exaggerated for convenience of explanation. Mean-while, embodiments to be described are merely examples, and various modifications may be made from such embodiments.

When an expression "above" or "on" may include not only "directly on/under/at left/right contacting", but also "on/under/at left/right contactlessly". Singular forms include plural forms unless apparently indicated otherwise contextually. When a portion is referred to as "comprising" a component, the portion does not exclude another component but may further include another component unless stated otherwise.

The use of the terms of "the above-described" and similar indicative terms may correspond to both the singular forms and the plural forms. When there is an explicit description of the order of operations of the method or there is no description contrary thereto, these operations may be performed in an appropriate order and the order is not necessarily limited to the described order.

The term used herein such as "unit" or "module" indicates a unit for processing at least one function or operation, and may be implemented in hardware, software, or in a combination of hardware and software.

Connections of lines or connection members between components shown in the drawings are illustrative of functional connections and/or physical or circuit connections, and in practice, may be represented as alternative or additional various functional connections, physical connections, or circuit connections.

The use of all examples or exemplary terms is only to describe technical spirit in detail, and the scope is not limited by these examples or terms unless limited by the claims.

FIG. 1 schematically illustrates a cross-section of a nitride-based semiconductor light-emitting device 100 according to an embodiment.

Referring to FIG. 1, the nitride-based semiconductor light-emitting device 100 may include a first conductive type nitride-based semiconductor layer 110, a strain relaxation layer 150, a light-emitting layer 140, and a second conductive type nitride-based semiconductor layer 160. Each layer included in the nitride-based semiconductor light-emitting device 100 may be formed by epitaxial growth using, for example, metal-organic chemical vapor deposition (MOCVD).

The first and second conductive type nitride-based semiconductor layers 110 and 160 may respectively include a group III-V semiconductor compound (e.g., GaN). For example, the first conductive type nitride-based semiconductor layer 110 may be an n-type GaN layer and the second conductive type nitride-based semiconductor layer 160 may be a p-type GaN layer. However, embodiments are not limited thereto, and in embodiments the first conductive type nitride-based semiconductor layer 110 may be a p-type GaN layer and the second conductive type nitride-based semiconductor layer 160 may be an n-type GaN layer.

The first conductive type nitride-based semiconductor layer 110 may be formed by being grown on a growth substrate. When the first conductive type nitride-based semiconductor layer 110 includes GaN, a GaN substrate may be used as the growth substrate. However, embodiments are not limited thereto, and a substrate of other materials than the GaN substrate (e.g., a sapphire substrate, a silicon substrate, etc.) may be used as the growth substrate. In this case, a buffer layer may be further provided between the growth substrate and the first conductive type nitride-based semiconductor layer 110.

The strain relaxation layer 150 may be provided on the first conductive type nitride semiconductor layer 110, and the light-emitting layer 140 may be provided on the strain relaxation layer 150. The light-emitting layer 140 may have a multi-quantum well (MQW) structure in which a plurality of quantum well layers 141 and a plurality of quantum barrier layers 142 are stacked alternatingly. In embodiments, the plurality of quantum well layers 141 and the plurality of quantum barrier layers 142 being stacked alternatingly may mean that a first quantum well layer 141 may be provided on a first quantum barrier layer 142, a second quantum barrier layer 142 may be provided on the first quantum well layer 141, a second quantum well layer 141 may be provided on the second quantum barrier layer 142, and so on.

A quantum well layer 141 may include a nitride-based semiconductor including In. For example, the quantum well layer 141 may include an InGaN layer. Blue light, green light, or red light may be emitted from the InGaN layer of the quantum well layer 141, depending on an Indium (In) content included in the InGaN layer. For example, light having a longer wavelength may be emitted from the InGaN layer of the quantum well layer 141 as the In content increases. A quantum barrier layer 142 between the quantum well layers 141 may include a nitride-based semiconductor. For example, the quantum barrier layer 142 may include a GaN layer. However, embodiments are not limited thereto.

Although the light-emitting layer 140 is described above as including a quantum well, embodiments are not limited thereto. For example, the light-emitting layer 140 may include quantum dots (QDs), quantum wires, etc.

The strain relaxation layer 150 may be provided between the first conductive type nitride semiconductor layer 110 and the light-emitting layer 140. The strain relaxation layer 150 may be provided to reduce a crystal defect that may occur due to a mismatch in lattice constant and a difference in thermal expansion coefficient between a material (e.g., GaN) of the first conductive type nitride semiconductor layer 110 and a material (e.g., InGaN) of the light-emitting layer 140.

The strain relaxation layer 150 may include a superlattice buffer layer 120 and an AlGaN layer 130 provided in the superlattice buffer layer 120. The superlattice buffer layer 120 may have a superlattice structure including material layers of two or more types which may be alternatingly grown or stacked. Each material layer of the superlattice buffer layer 120 may have a thickness of several nanometers or less.

The superlattice buffer layer 120 may include a plurality of first material layers 121 and a plurality of second material layers 122 which may be alternatingly grown on a top surface of the first conductive type nitride-based semiconductor layer 110. A first material layer 121 may include a nitride-based semiconductor including In. For example, the first material layer 121 may include an InGaN layer. A second material layer 122 between the first material layers 121 may include a nitride-based semiconductor. For example, the second material layer 122 may include a GaN layer. However, embodiments are not limited thereto.

The first material layer 121 included in the superlattice buffer layer 120 may have a lattice constant between the first conductive type nitride-based semiconductor layer 110 (e.g., a GaN layer) and the quantum well layer 141 (e.g., the InGaN layer) of the light-emitting layer 140. For example, when the first material layer 121 of the superlattice buffer layer 120 and the quantum well layer 141 of the light-emitting layer 140 include InGaN, a lattice constant of the InGaN of the first material layer 121 may be lower than a lattice constant than InGaN of the quantum well layer 141. In this case, InGaN of the first material layer 121 may have a lower In content than the InGaN of the quantum well layer 141. For example, when the first conductive type nitride-based semiconductor layer 110 includes GaN with a lattice constant of about 3.19 and the quantum well layer 141 of the light-emitting layer 140 includes $In_{0.34}Ga_{0.8}N$ with a lattice constant of about 3.31, the first material layer 121 of the superlattice buffer layer 120 may include $In_{0.2}Ga_{0.8}N$ with a lattice constant of about 3.26. However, this is merely an example for convenience of a description, and an In content may be variously adjusted in the quantum well layer 141 of the light-emitting layer 140 and the first material layer 121 of the superlattice buffer layer 120.

The AlGaN layer 130 may be provided in the superlattice buffer layer 120. In embodiments, a part of the AlGaN layer 130 may have a triangle-shaped cross-section in a vertical direction (i.e., a z-direction in FIG. 1, also referred to as a thickness direction of the nitride-based semiconductor light-emitting device 100). In the superlattice buffer layer 120, at a position where the AlGaN layer 130 is formed, V-shaped pits 135 may be formed, and the AlGaN layer 130 may be formed in an inverted-pyramid shape or a conical shape to fill and/or cover the V-shaped pits 135. the AlGaN layer 130 Thus, at least a portion of the AlGaN layer 130 may have a triangle-shaped cross-section, when the AlGaN layer 130 is cut vertically perpendicular to its surface. When the AlGaN layer 130 is cut parallel to its surface, at least a portion of the AlGaN layer 130 may have a polygon-shaped cross-section or a circle-shaped cross section. While the pits 135 are referred to as "V-shaped" pits, their shape is not strictly limited to a V-shape. For instance, the pits 135 may also exhibit a U-shape without a sharp apex point. The portions of the AlGaN layer 130 that fill the pits 134 may be referred to as protrusions. When viewed from the top of the nitride-based semiconductor light-emitting device 100, a cross-sectional area of the protrusions decreases in the vertical direction from the second conductive type nitride-based semiconductor 160 to the first conductive type nitride-based semiconductor 110. The portions of the AlGaN layer 130 that occupy the pits 134 may be referred to as protrusions. When viewed from the top of the nitride-based semiconductor light-emitting device 100, each protrusion exhibits a decreasing cross-sectional area as it extends vertically from the top towards the bottom. In the present disclosure, the cross-sectional area viewed from the top of the nitride-based semiconductor light-emitting device 100 may be referred to as a horizontal cross-sectional area.

The AlGaN layer 130 including the triangle-shaped cross-section may be formed by a process below. First, the plurality of first material layers 121 (e.g., InGaN layers) and the plurality of second material layers 122 (e.g., GaN layers) may be alternatingly grown on a top surface of the first conductive type nitride-based semiconductor layer 110 by MOCVD, thereby forming a part of the superlattice buffer layer 120 to a certain thickness. The thickness of the superlattice buffer layer 120 formed in this way may be equal to or greater than a minimum thickness for strain relaxation.

The V-shaped pits 135 generated by the strain relaxation process may be formed on the surface of the superlattice buffer layer 120. Next, the AlGaN layer 130 may be formed to fill and/or cover the V-shaped pits 135 formed in the superlattice buffer layer 120 by MOCVD. Thus, the AlGaN layer 130 having triangle-shaped cross-sections covering the V-shaped pits 135 may be formed on a surface of the superlattice buffer layer 120 formed to the thickness. Next, the plurality of first material layers 121 (e.g., InGaN layers) and the plurality of second material layers 122 (e.g., GaN layers) may be alternatingly grown on the top surface of the AlGaN layer 130. Thus, the strain relaxation layer 150 may be formed which includes the superlattice buffer layer 120 and the AlGaN layer 130 including a triangle-shaped cross-section formed in the superlattice buffer layer 120. In embodiments, on the surface of the strain relaxation layer 150 under the light-emitting layer 140, V-shaped pits of a relatively small size may be formed in the surface of the strain relaxation layer 150 as described below.

The AlGaN layer 130 including a triangle-shaped cross-section provided in the superlattice buffer layer 120 may suppress propagation of dislocations occurring in the superlattice buffer layer 120 toward the light-emitting layer 140 in the strain relaxation process as described below. As a result, a crystal defect may be reduced in the light-emitting layer 140 on the strain relaxation layer 150, thereby implementing a light-emitting device 100 having an improved light-emission efficiency.

Figure 2A:
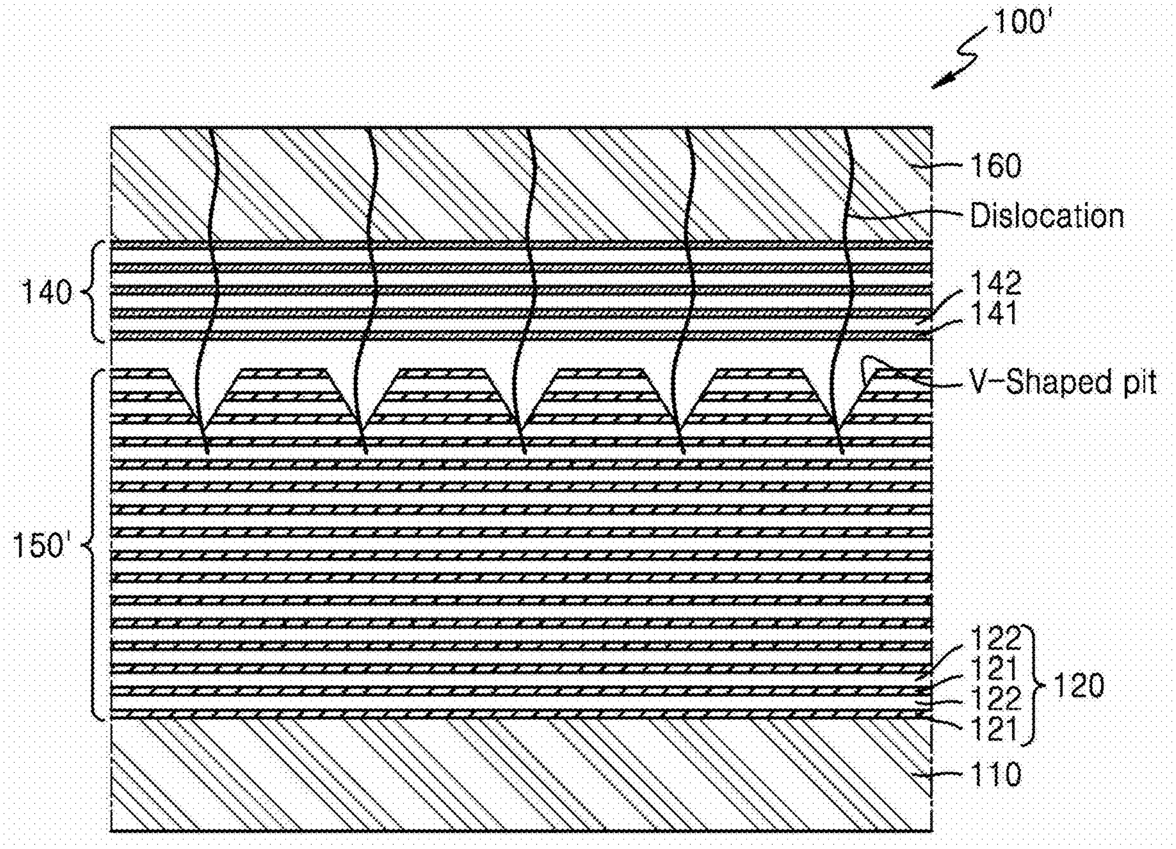
FIG. 2A illustrates a state in which dislocations occurring in a strain relaxation process propagate toward a light-emitting layer in a nitride-based semiconductor light-emitting device according to an embodiment.

FIG. 2A illustrates a state in which dislocations occurring in a strain relaxation process propagate toward the light-emitting layer 140 in a nitride-based semiconductor light-emitting device 100' according to an embodiment.

The nitride-based semiconductor light-emitting device 100' shown in FIG. 2A may be different from the nitride-based semiconductor light-emitting device 100 in that a strain relaxation layer 150' of the nitride-based semiconductor light-emitting device 100' includes the superlattice buffer layer 120 and does not include an AlGaN layer (130 of FIG. 1).

Referring to FIG. 2A, the nitride-based semiconductor light-emitting device 100' may include the strain relaxation layer 150' and the light-emitting layer 140 provided on the strain relaxation layer 150'. The strain relaxation layer 150' may include the superlattice buffer layer 120 in which the plurality of first material layers 121 (e.g., InGaN layers) are stacked alternatingly with the plurality of second material layers 122 (e.g., GaN layers). The light-emitting layer 140 may include the plurality of quantum well layers 141 (e.g., InGaN layers) stacked alternatingly with the plurality of quantum barrier layers 142 (e.g., GaN layers).

In the nitride-based semiconductor light-emitting device 100' shown in FIG. 2A, V-shaped pits may be formed in the surface of the strain relaxation layer 150' under the light-emitting layer 140 in the strain relaxation process. In the V-shaped pits, dislocations may occur and propagate toward the light-emitting layer 140 located thereon.

Figure 2B:
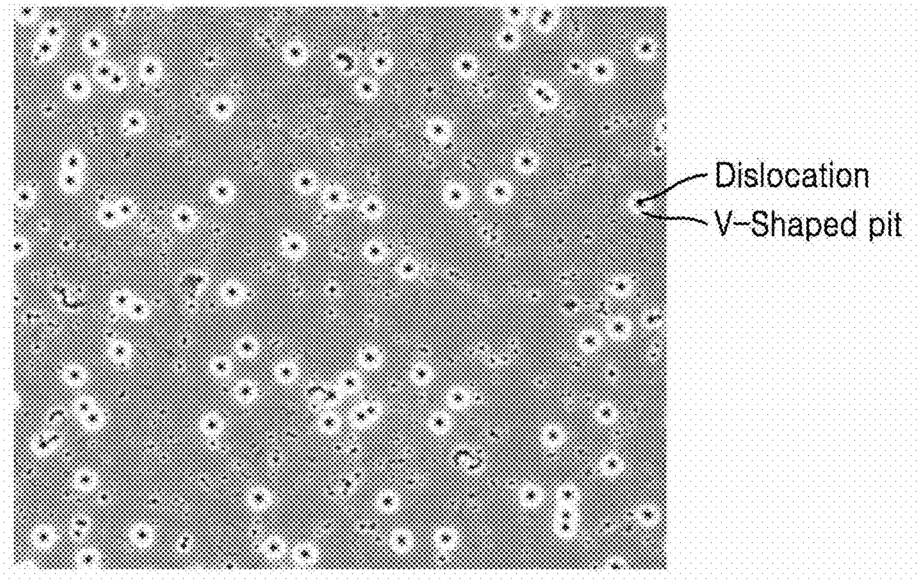
FIG. 2B shows a scanning electron microscope (SEM) picture of a surface of a strain relaxation layer in the nitride-based semiconductor light-emitting device of FIG. 2A according to an embodiment.

FIG. 2B shows a scanning electron microscope (SEM) picture of a surface of the strain relaxation layer 150' in the nitride-based semiconductor light-emitting device 100' shown in FIG. 2A, according to embodiments.

Referring to FIG. 2B, it may be seen that V-shaped pits and dislocations of relatively high densities may occur on the surface of the strain relaxation layer 150'. The dislocations occurring on the strain relaxation layer 150' may propagate toward the light-emitting layer 140 as shown in FIG. 2A, such that a crystal defect of a relatively high density may exist in the light-emitting layer 140, lowering a light-emission efficiency.

Figure 3A:
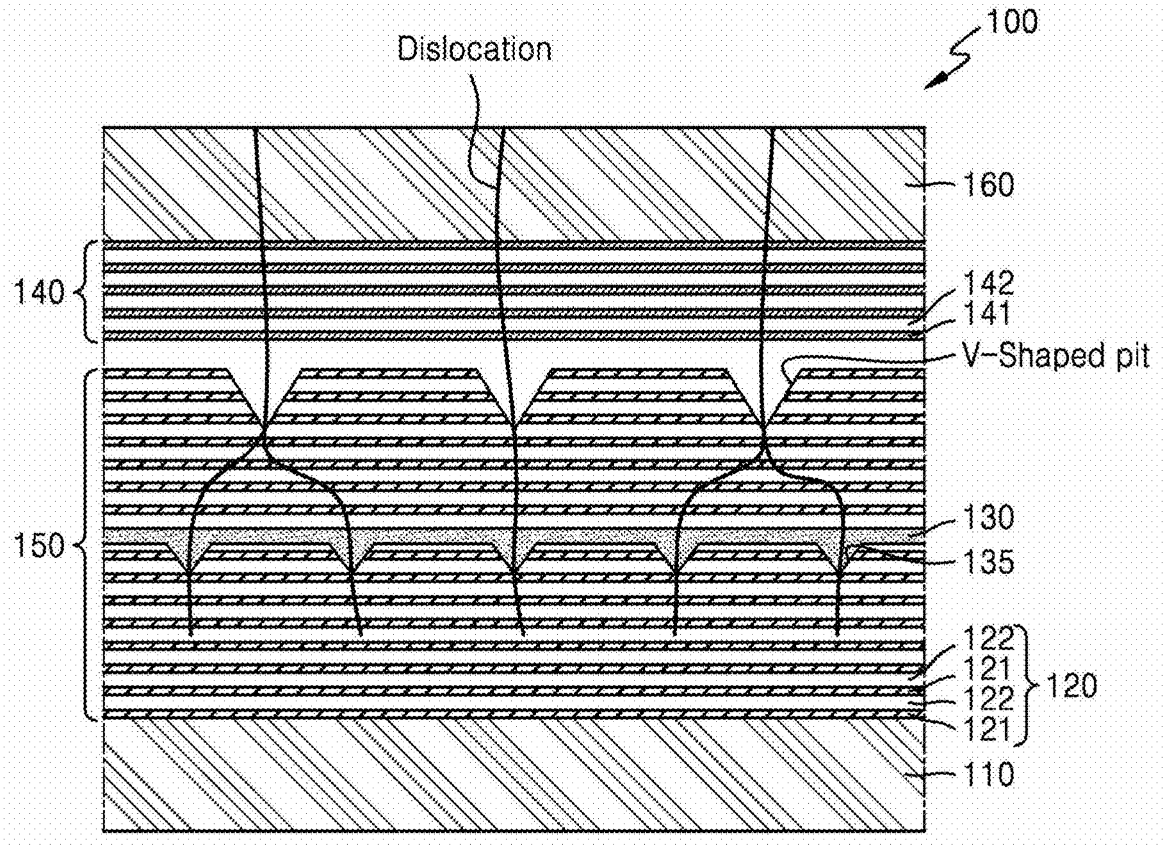
FIG. 3A illustrates a state in which dislocations occurring in a strain relaxation process propagate toward a light-emitting layer in a nitride-based semiconductor light-emitting device according to an embodiment.

FIG. 3A illustrates a state in which dislocations occurring in a strain relaxation process propagate toward the light-emitting layer 140 in the nitride-based semiconductor light-emitting device 100 according to an embodiment.

Referring to FIG. 3A, the nitride-based semiconductor light-emitting device 100 may include the strain relaxation layer 150 and the light-emitting layer 140 provided on the strain relaxation layer 150. The strain relaxation layer 150 may include the superlattice buffer layer 120 and the AlGaN layer 130 having a triangle-shaped cross-section provided in the superlattice buffer layer 120. The light-emitting layer 140 may include the plurality of quantum well layers 141 (e.g., InGaN layers) stacked alternatingly with the plurality of quantum barrier layers 142 (e.g., GaN layers).

The V-shaped pits 135 may be formed in the superlattice buffer layer 120 where the AlGaN layer 130 is located, and the AlGaN layer 130 may be formed to fill and/or cover the V-shaped pits 135. Also, on the surface of the strain relaxation layer 150 under the light-emitting layer 140, V-shaped pits generated in the strain relaxation process may be formed. Herein, the V-shaped pits formed in the surface of the strain relaxation layer 150 under the light-emitting layer 140 may be formed with smaller size and lower density than those of the V-shaped pits formed in the surface of the strain relaxation layer 150' in the nitride-based semiconductor light-emitting device 100' shown in FIG. 2A.

In the nitride-based semiconductor light-emitting device 100 shown in FIG. 3A, dislocations may occur in the V-shaped pits 135 formed in the superlattice buffer layer 120 and propagate upwardly. Herein, the AlGaN layer 130 including the triangle-shaped cross-section formed to fill the V-shaped pits 135 in the superlattice buffer layer 120 may bend a moving direction of the dislocations occurring in the superlattice buffer layer 120. Therefore, some dislocations occurring in the superlattice buffer layer 120 may be combined with one another, and the combined dislocations may propagate toward the light-emitting layer 140 through the V-shaped pits formed in the surface of the strain relaxation layer 150 under the light-emitting layer 140.

Figure 3B:
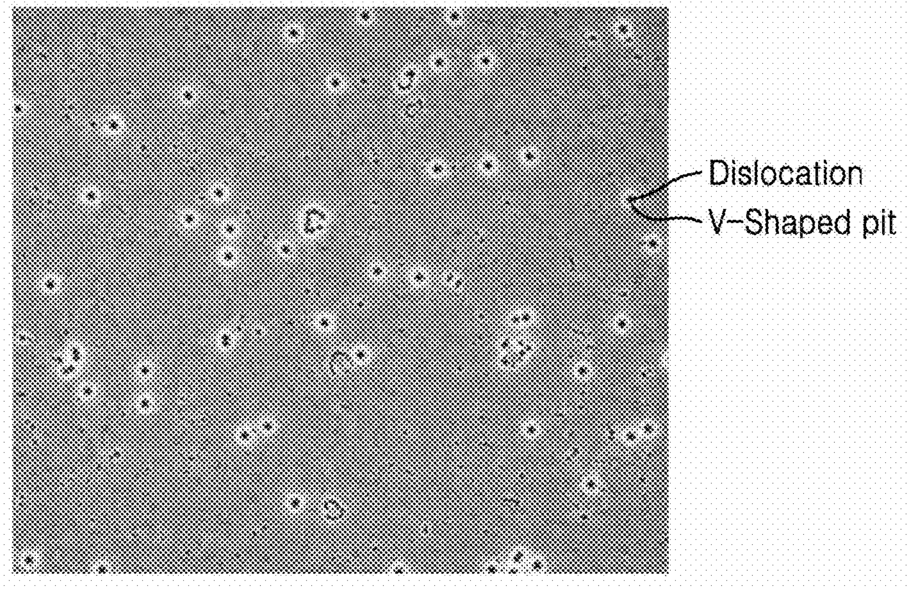
FIG. 3B shows an SEM picture of a surface of a strain relaxation layer in the nitride-based semiconductor light-emitting device of FIG. 3A according to an embodiment.

FIG. 3B shows an SEM picture of the surface of the strain relaxation layer 150 in the nitride-based semiconductor light-emitting device 100 according to the embodiment shown in FIG. 3A.

Referring to FIG. 3B, it may be seen that V-shaped pits and dislocations of relatively low densities may occur on the surface of the strain relaxation layer 150. This may mean that the AlGaN layer 130 provided in the superlattice buffer layer 120 bends the moving direction of the dislocations occurring in the superlattice buffer layer 120, such that some dislocations are combined with each other and the combined dislocations propagate toward V-shaped pits formed in the surface of the strain relaxation layer 150 under the light-emitting layer 140.

The dislocations propagating toward the surface of the strain relaxation layer 150 may propagate toward the light-emitting layer 140 as shown in FIG. 3A, such that a crystal defect having a relatively low density may exist in the light-emitting layer 140, improving a light-emission efficiency.

When a light-emitting layer includes an InGaN layer, an In content of the InGaN layer may be increased to implement light of a long wavelength. However, when an In content increases in the InGaN layer, a mismatch in lattice constant between the GaN layer and the InGaN layer increases, and in this case, it may be difficult to reduce a crystal defect occurring in the light-emitting layer merely with the superlattice buffer layer.

In the nitride-based semiconductor light-emitting device 100 according to an embodiment, the AlGaN layer 130 including the triangle-shaped cross-section may be formed in the superlattice buffer layer 120, thereby bending the moving direction of dislocations occurring in the strain relaxation process of the superlattice buffer layer 120 and thus lowering the density of the dislocations propagating toward the light-emitting layer 140 through the surface of the strain relaxation layer 150. Thus, by reducing the crystal defect present in the light-emitting layer 140, a light-emitting device with an improved light-emission efficiency in various wavelength ranges may be implemented. Moreover, by applying such a light-emitting device as a light source of each of red, green, and blue pixels, a display device having high efficiency and reliability may be implemented.

Figure 4:
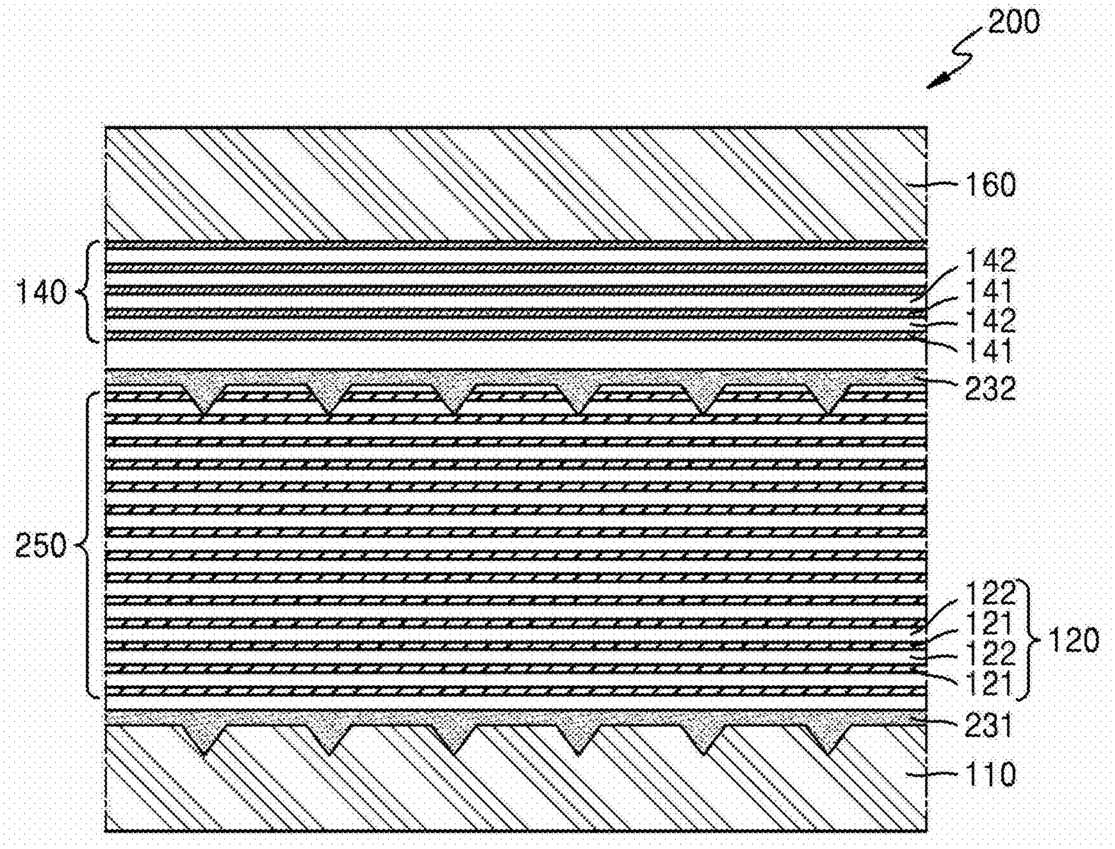
FIG. 4 schematically illustrates a cross-section of a nitride-based semiconductor light-emitting device according to an embodiment.

FIG. 4 schematically illustrates a cross-section of a nitride-based semiconductor light-emitting device 200 according to another embodiment.

Referring to FIG. 4, the nitride-based semiconductor light-emitting device 200 may include the first conductive type nitride-based semiconductor layer 110, a strain relaxation layer 250, the light-emitting layer 140, and the second conductive type nitride-based semiconductor layer 160. For example, the first conductive type nitride-based semiconductor layer 110 may be an n-type GaN layer and the first conductive type nitride-based semiconductor layer 160 may a p-type GaN layer, however embodiments are not limited thereto, and in embodiments the first conductive type nitride-based semiconductor layer 110 may be a p-type GaN layer and the second conductive type nitride-based semiconductor layer 160 may be an n-type GaN layer. On the first conductive type nitride semiconductor layer 110, the strain relaxation layer 250 and the light-emitting layer 140 may be sequentially stacked.

The light-emitting layer 140 may have an MQW structure including a plurality of quantum well layers 141 stacked alternatingly with a plurality of quantum barrier layers 142. A quantum well layer 141 may include a nitride-based semiconductor including In. For example, the quantum well layer 141 may include an InGaN layer. A quantum barrier layer 142 may include a nitride-based semiconductor. For example, the quantum barrier layer 142 may include a GaN layer.

The strain relaxation layer 250 may include the superlattice buffer layer 120, a first AlGaN layer 231 provided under the superlattice buffer layer 120, and a second AlGaN layer 232 provided on the superlattice buffer layer 120. The superlattice buffer layer 120 may include a plurality of first material layers 121 and a plurality of second material layers 122 that are alternatingly grown on a top surface of the first conductive type nitride-based semiconductor layer 110. A first material layer 121 may include a nitride-based semiconductor including In (e.g., the InGaN layer). A second material layer 122 may include a nitride-based semiconductor (e.g., the GaN layer).

The first AlGaN layer 231 may be provided between the first conductive type nitride-based semiconductor layer 110 and the superlattice buffer layer 120. The first AlGaN layer 231 may include a triangle-shaped cross-section. V-shaped pits generated in the strain relaxation process may be formed on the surface of the first conductive type nitride-based semiconductor layer 110 under the superlattice buffer layer 120, and the first AlGaN layer 231 may be formed to fill and/or cover the V-shaped pits.

The second AlGaN layer 232 may be provided between the superlattice buffer layer 120 and the light-emitting layer 143. The second AlGaN layer 232 may include a triangle-shaped cross-section. V-shaped pits generated in the strain relaxation process may be formed on the surface of the superlattice buffer layer 120 under the light-emitting layer 140, and the second AlGaN layer 232 may be formed to fill and/or cover the V-shaped pits.

Like the AlGaN layer 130 provided in the superlattice buffer layer 120 in FIG. 3A, the first and second AlGaN layers 231 and 232 may suppress propagation of dislocations occurring in the strain relaxation process toward the light-emitting layer 140. In this way, the crystal defects present in the light-emitting layer 140 may be reduced, thereby implementing a light-emitting device with an improved light-emission efficiency. Although the first and second AlGaN layers 231 and 232 are described above as being provided under and on the superlattice buffer layer 120, embodiments are not limited thereto. For example, in embodiments the AlGaN layer may be provided either under or on the superlattice buffer layer 120.

Figure 5:
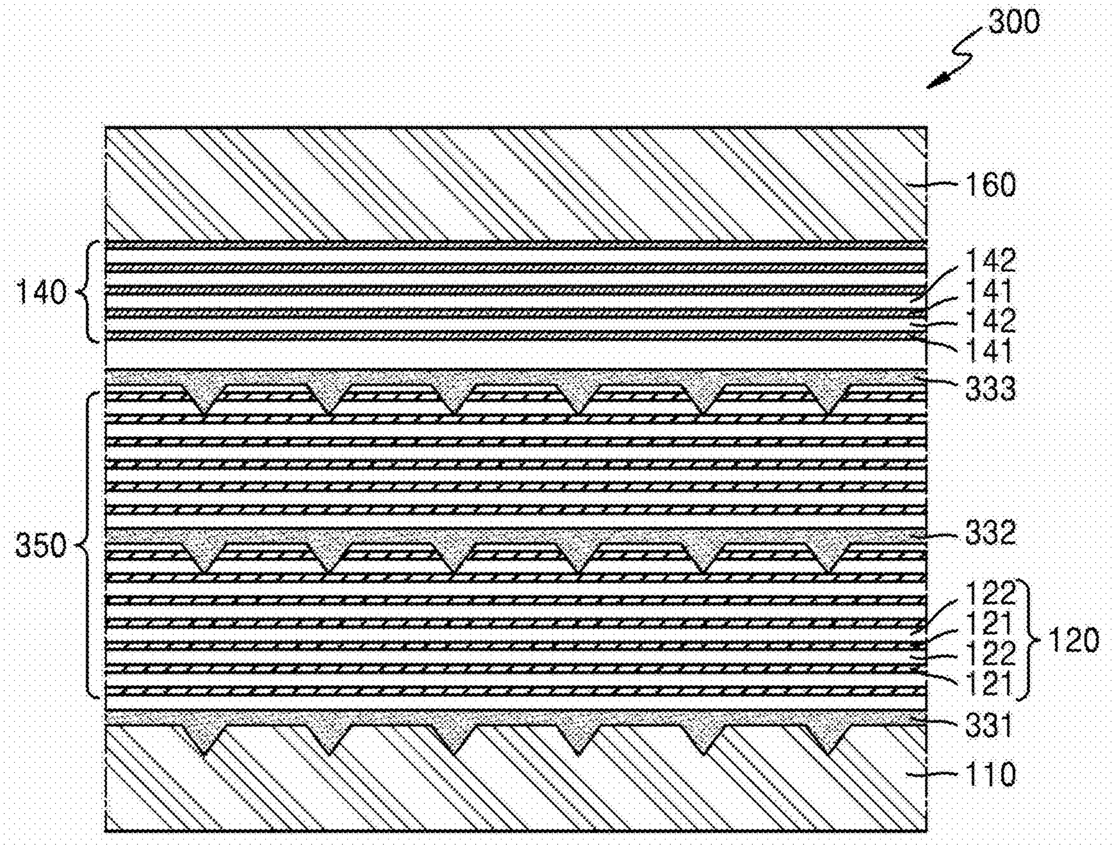
FIG. 5 schematically illustrates a cross-section of a nitride-based semiconductor light-emitting device according to an embodiment.

FIG. 5 schematically illustrates a cross-section of a nitride-based semiconductor light-emitting device 300 according to another embodiment.

Referring to FIG. 5, the nitride-based semiconductor light-emitting device 300 may include the first conductive type nitride-based semiconductor layer 110, a strain relaxation layer 350, the light-emitting layer 140, and the second conductive type nitride-based semiconductor layer 160. For example, the first conductive type nitride-based semiconductor layer 110 may be an n-type GaN layer and the second conductive type nitride-based semiconductor layer 160 may be a p-type GaN layer, however embodiments are not limited thereto, and in embodiments the first conductive type nitride-based semiconductor layer 110 may be a p-type GaN layer and the second conductive type nitride-based semiconductor layer 160 may be an n-type GaN layer. On the first conductive type nitride semiconductor layer 110, the strain relaxation layer and the light-emitting layer 140 may be sequentially stacked.

The light-emitting layer 140 may have an MQW structure including a plurality of quantum well layers 141 stacked alternatingly with a plurality of quantum barrier layers 142. A quantum well layer 141 may include a nitride-based semiconductor (e.g., an InGaN layer) including In, and a quantum barrier layer 142 may include a nitride-based semiconductor (e.g., a GaN layer).

The strain relaxation layer 350 may include the superlattice buffer layer 120, a first AlGaN layer 331 provided under the superlattice buffer layer 120, an second AlGaN layer 332 provided in the superlattice buffer layer 120, and a third AlGaN layer 333 provided on the superlattice buffer layer 120. The superlattice buffer layer 120 may include a plurality of first material layers 121 and a plurality of second material layers 122 that are alternatingly grown on a top surface of the first conductive type nitride-based semiconductor layer 110. A first material layer 121 may include a nitride-based semiconductor including In (e.g., the InGaN layer). A second material layer 122 may include a nitride-based semiconductor (e.g., the GaN layer).

The first AlGaN layer 331 may be provided between the first conductive type nitride-based semiconductor layer 110 and the superlattice buffer layer 120 and may include a triangle-shaped cross-section. The second AlGaN layer 332 may be provided in the superlattice buffer layer 120 and may include a triangle-shaped cross-section. The third AlGaN layer 333 may be provided between the superlattice buffer layer 120 and the light-emitting layer 140 and may include a triangle-shaped cross-section.

The first AlGaN layer 331, the second AlGaN layer 332, and the third AlGaN layer 333 may suppress propagation of dislocations occurring in the strain relaxation process toward the light-emitting layer 140, and thus crystal defects present in the light-emitting layer 140 may be reduced, thereby implementing a light-emitting device with an improved light-emission efficiency. Although the first and third AlGaN layers 331 and 333 are described above as being provided under and on the superlattice buffer layer 120, embodiments are not limited thereto. For example, the AlGaN layer may be provided either under or on the superlattice buffer layer 120.

Figure 6:
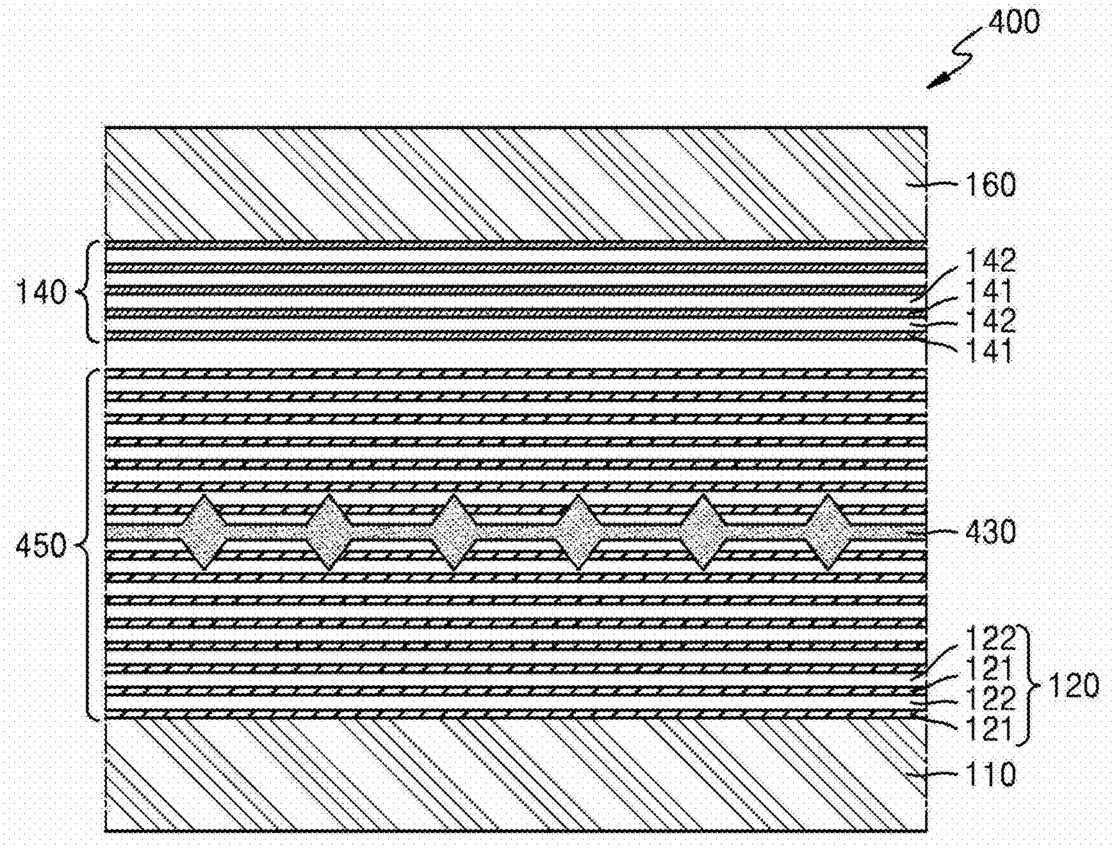
FIG. 6 schematically illustrates a cross-section of a nitride-based semiconductor light-emitting device according to an embodiment.

FIG. 6 schematically illustrates a cross-section of a nitride-based semiconductor light-emitting device 400 according to another embodiment.

Referring to FIG. 6, the nitride-based semiconductor light-emitting device 400 may include the first conductive type nitride-based semiconductor layer 110, a strain relaxation layer 450, the light-emitting layer 140, and the second conductive type nitride-based semiconductor layer 160. For example, the first conductive type nitride-based semiconductor layer 110 may be an n-type GaN layer and the second conductive type nitride-based semiconductor layer may be a p-type GaN layer, however embodiments are not limited thereto, and in embodiments the first conductive type nitride-based semiconductor layer 110 may be a p-type GaN layer and the second conductive type nitride-based semiconductor layer 160 may be an n-type GaN layer. On the first conductive type nitride semiconductor layer 110, the strain relaxation layer and the light-emitting layer 140 may be sequentially stacked.

The light-emitting layer 140 may have an MQW structure including a plurality of quantum well layers 141 stacked alternatingly with a plurality of quantum barrier layers 142. A quantum well layer 141 may include a nitride-based semiconductor (e.g., an InGaN layer) including In, and a quantum barrier layer 142 may include a nitride-based semiconductor (e.g., a GaN layer).

The strain relaxation layer 450 may include the superlattice buffer layer 120 and an AlGaN layer 430 provided in the superlattice buffer layer 120. The superlattice buffer layer 120 may include a plurality of first material layers 121 and a plurality of second material layers 122 that are alternatingly grown on a top surface of the first conductive type nitride-based semiconductor layer 110. A first material layer 121 may include a nitride-based semiconductor including In (e.g., the InGaN layer). A second material layer 122 may include a nitride-based semiconductor (e.g., the GaN layer).

The AlGaN layer 430 provided in the superlattice buffer layer 120 may include a diamond-shaped cross-section. On the superlattice buffer layer 120 at a position where the AlGaN layer 430 is formed, V-shaped pits may be formed. The AlGaN layer 430 may be formed by growing AlGaN in an inverted pyramid shape to cover V-shaped pits, and then growing AlGaN in a pyramid shape thereon. Thus, the AlGaN layer 430 may include a diamond-shaped cross-section. The AlGaN layer 430 may be located above a minimum thickness of the superlattice buffer layer 120 at which strain relaxation occurs.

The AlGaN layer 430 having a diamond-shaped cross-section provided in the superlattice buffer layer 120 may suppress propagation of dislocations occurring in the superlattice buffer layer 120 toward the light-emitting layer 140 in the strain relaxation process as described below. As a result, a crystal defect may be reduced in the light-emitting layer 140 on the strain relaxation layer 150, thereby implementing the light-emitting device 100 having an improved light-emission efficiency. Moreover, by applying such a light-emitting device as a light source of each of red, green, and blue pixels, a display device having high efficiency and reliability may be implemented.

Although AlGaN layer 430 is described above as being provided in the superlattice buffer layer 120, embodiments are not limited thereto. For example, in embodiments an AlGaN layer may be further provided on and/or under a superlattice buffer layer.

Figure 7:
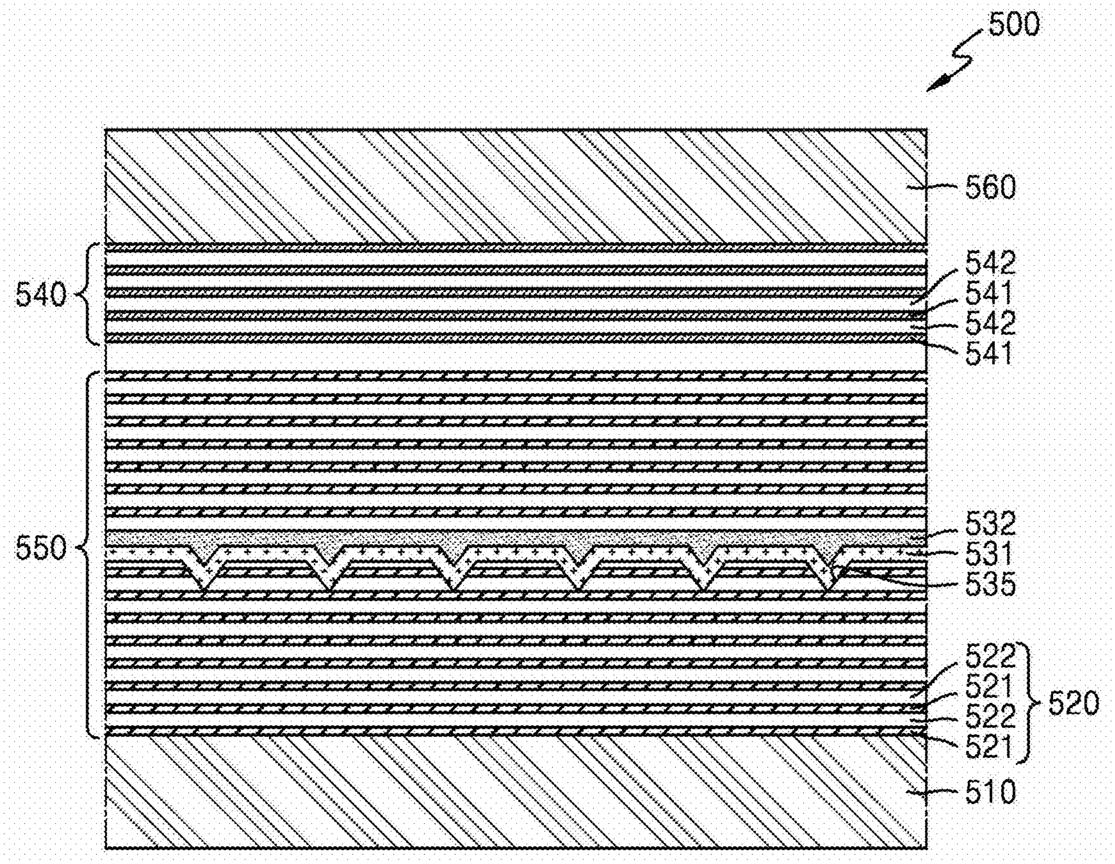
FIG. 7 schematically illustrates a cross-section of a nitride-based semiconductor light-emitting device according to an embodiment.

FIG. 7 schematically illustrates a cross-section of a nitride-based semiconductor light-emitting device (500) according to an embodiment.

Referring to FIG. 7, the nitride-based semiconductor light-emitting device 500 may include a first conductive type nitride-based semiconductor layer 510, a strain relaxation layer 550, a light-emitting layer 540, and a second conductive type nitride-based semiconductor layer 560. The first and second conductive type nitride-based semiconductor layers 510 and 560 may respectively include a group III-V semiconductor compound (e.g., GaN). For example, the first conductive type nitride-based semiconductor layer 510 may be an n-type GaN layer and the second conductive type nitride-based semiconductor layer 560 may be a p-type GaN layer. However, embodiments are not limited thereto.

The first conductive type nitride-based semiconductor layer 510 may be formed by being grown on a growth substrate. For example, when the first conductive type nitride-based semiconductor layer 510 includes GaN, a GaN substrate may be used as the growth substrate. A buffer layer may be further provided between the growth substrate and the first conductive type nitride-based semiconductor layer 510. The strain relaxation layer 550 may be provided on the first conductive type nitride semiconductor layer 510, and the light-emitting layer 540 may be provided on the strain relaxation layer 550. The light-emitting layer 540 may have a multi-quantum well (MQW) structure in which a plurality of quantum well layers 541 and a plurality of quantum barrier layers 542 are stacked alternatingly. A quantum well layer 541 may include a nitride-based semiconductor including In. For example, the quantum well layer 541 may include an InGaN layer. A quantum barrier layer 542 between the quantum well layers 541 may include a nitride-based semiconductor. For example, the quantum barrier layer 542 may include a GaN layer. However, embodiments are not limited thereto.

The strain relaxation layer 550 may be provided between the first conductive type nitride-based semiconductor layer 510 and the light-emitting layer 540. The strain relaxation layer 550 may include a superlattice buffer layer 520 and an AlN layer 531 and an AlGaN layer 532 provided in the superlattice buffer layer 520.

The superlattice buffer layer 520 may include a plurality of first material layers 521 and a plurality of second material layers 522 which may be alternatingly grown on a top surface of the first conductive type nitride-based semiconductor layer 510. The first material layer 521 may include a nitride-based semiconductor including In. For example, the first material layer 521 may include an InGaN layer. The second material layer 522 between the first material layers 521 may include a nitride-based semiconductor. For example, the second material layer 522 may include a GaN layer. However, embodiments are not limited thereto. The first material layer 521 included in the superlattice buffer layer 520 may have a lattice constant between the first conductive type nitride-based semiconductor layer 510 (e.g., a GaN layer) and the quantum well layer 541 (e.g., an InGaN layer) of the light-emitting layer 540.

The AlN layer 531 and the AlGaN layer 532 may be provided in the superlattice buffer layer 520. In the superlattice buffer layer 520, at a position where the AlN layer 531 and the AlGaN layer 130 are to be formed, V-shaped pits 535 may be formed. The AlN layer 531 and the AlGaN layer 532 may be sequentially formed to cover the V-shaped pits 535, such that the AlN layer 531 and the AlGaN layer 532 in an inverted-pyramid shape may be formed in the V-shaped pits 135. Thus, the AlN layer 531 and the AlGaN layer 532 may have a triangle-shaped cross-section in the V-shaped pits 535.

The AlN layer 531 and the AlGaN layer 532 including a triangle-shaped cross-section provided in the superlattice buffer layer 520 may suppress propagation of dislocations occurring in the superlattice buffer layer 520 toward the light-emitting layer 540 in the strain relaxation process. As a result, a crystal defect may be reduced in the light-emitting layer 540 on the strain relaxation layer 550, thereby implementing the light-emitting device 500 having an improved light-emission efficiency.

When only an AlN layer is formed in the V-shaped pits 535 formed in the superlattice buffer layer 520, it is possible to reduce the density of a propagating defect by a dislocation bending effect for the superlattice buffer layer 520 of a predetermined thickness or greater due to a strain field difference on an interface between the AlN layer and the GaN layer (or the InGaN layer). However, when the thickness of the superlattice buffer layer 520 exceeds a minimum thickness (i.e., a threshold thickness) for strain relaxation, a defect may occur due to additional strain relaxation. When only an AlGaN layer is formed in the V-shaped pits 535 formed in the superlattice buffer layer 520, the minimum thickness (i.e., the threshold thickness) for strain relaxation may be secured as an appropriately thick thickness, but a dislocation bending effect may be reduced due to a small strain field difference on the interface between the AlGaN layer and the GaN layer (or the InGaN layer). In the current embodiment, by forming the AlN layer 531 and the AlGaN layer 532 having a triangle-shaped cross-section in the V-shaped pits 535 formed in the superlattice buffer layer 520, the minimum thickness (i.e., the threshold thickness) for strain relaxation may be secured as the appropriately thick thickness, and the density of a propagating defect may be reduced due to the dislocation bending effect.

Figure 8:
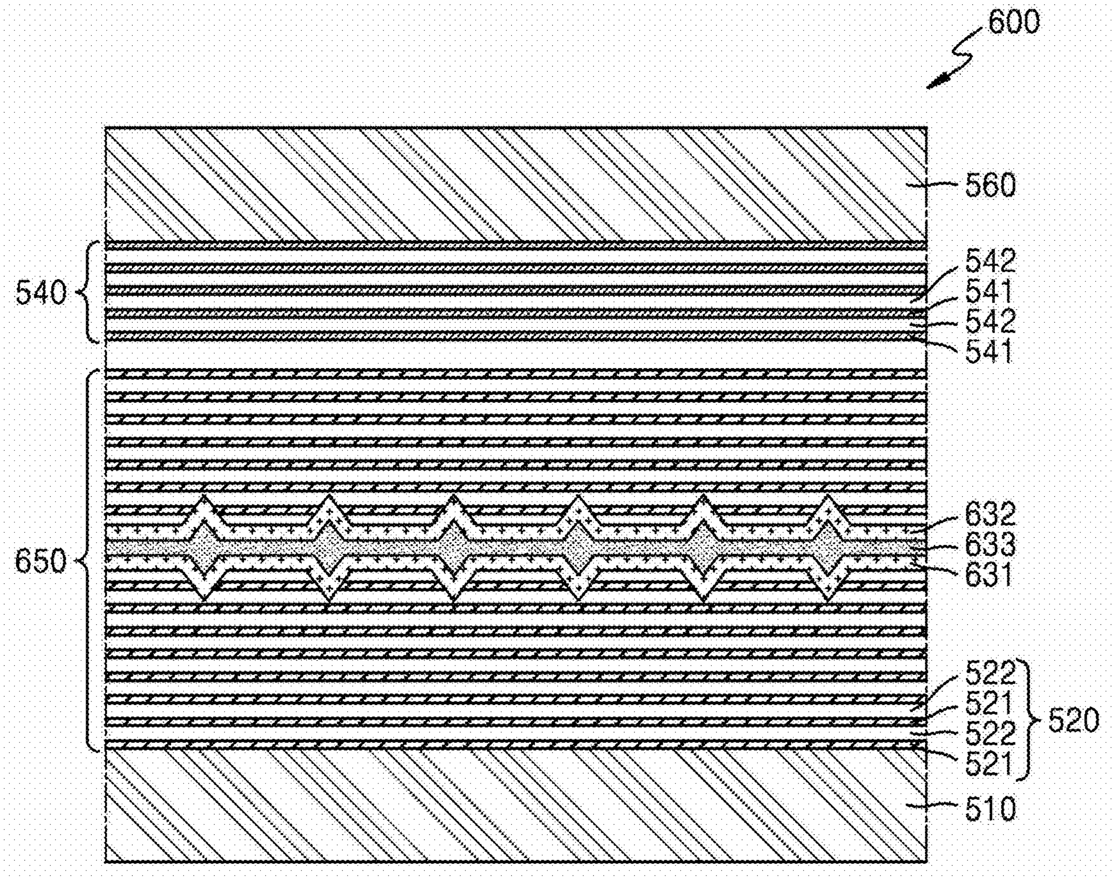
FIG. 8 schematically illustrates a cross-section of a nitride-based semiconductor light-emitting device according to an embodiment.

FIG. 8 schematically illustrates a cross-section of a nitride-based semiconductor light-emitting device (600) according to an embodiment.

Referring to FIG. 8, the nitride-based semiconductor light-emitting device 600 may include the first conductive type nitride-based semiconductor layer 510, a strain relaxation layer 650, the light-emitting layer 540, and the second conductive type nitride-based semiconductor layer 560. The first conductive type nitride-based semiconductor layer 510, the second conductive type nitride-based semiconductor layer 560, and the light-emitting layer 540 have been described above and thus will not be described at this time.

The strain relaxation layer 650 may include the superlattice buffer layer 520 and AlN layers 631 and 632 and an AlGaN layer 633 provided in the superlattice buffer layer 520. The superlattice buffer layer 520 may include the plurality of first material layers 521 and the plurality of second material layers 522 which may be alternatingly grown on the top surface of the first conductive type nitride-based semiconductor layer 510. For example, the first material layer 521 may include a nitride-based semiconductor including In (e.g., the InGaN layer), and the second material layer 522 may include a nitride-based semiconductor (e.g., the GaN layer).

The AlN layers 631 and 632 and the AlGaN layer 633 provided in the superlattice buffer layer 520 may include a diamond-shaped cross-section. In the superlattice buffer layer 120 at a position where the AlN layers 631 and 632 and the AlGaN layer 633 are to be formed, V-shaped pits may be formed. The AlN layer 631 and the AlGaN layer 633 may be grown in an inverted pyramid shape by being sequentially deposited to cover the V-shaped pits, and then the AlGaN layer 633 and the AlN layer 632 may be grown in a pyramid shape by being sequentially deposited thereon. Thus, the AlN layers 631 and 632 and the AlGaN layer 633 having a diamond-shaped cross-section may be formed. While it has been described that the AlN layers 631 and 632 are respectively formed on a bottom surface and a top surface of the AlGaN layer 633, the AlN layers 631 and 632 may be formed on any one of the top surface and the bottom surface of the AlGaN layer 633.

The AlN layers 631 and 632 and the AlGaN layer 633 having a diamond-shaped cross-section provided in the superlattice buffer layer 520 may suppress propagation of dislocations occurring in the superlattice buffer layer 520 toward the light-emitting layer 540 in the strain relaxation process. As a result, a crystal defect may be reduced in the light-emitting layer 540 on the strain relaxation layer 650, thereby implementing the light-emitting device 600 having an improved light-emission efficiency. Moreover, by applying such a light-emitting device as a light source of each of red, green, and blue pixels, a display device having high efficiency and reliability may be implemented.

According to embodiments, a strain relaxation layer provided between a first conductive type nitride-based semiconductor layer and a light-emitting layer includes a superlattice buffer layer and a triangle-shaped (or diamond-shaped) AlGaN layer (or AlN layer/AlGaN layer) formed in the superlattice buffer layer, thereby lowering the density of dislocations occurring in the superlattice buffer layer and propagating toward the light-emitting layer in the strain relaxation process. In this way, crystal defects present in the light-emitting layer may be reduced, thereby allowing the manufacture of a light-emitting device with an improved light-emission efficiency in various wavelength ranges. Moreover, by applying such a light-emitting device as a light source of each of red, green, and blue pixels, a display device having high efficiency and reliability may be implemented. The embodiments described above are intended to be examples, and various changes may be made therefrom by those of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it should be understood by those of ordinary skill in the art that various changes in form and details may be made therein without departing from the spirit and scope as defined by the following claims.

What is claimed is:

1. A nitride-based semiconductor light-emitting device comprising:

a first semiconductor layer, wherein the first semiconductor layer is nitride-based and has a first conductivity type;

a light-emitting layer provided on the first semiconductor layer, wherein the light-emitting layer comprises a nitride-based semiconductor comprising Indium (In);

a second semiconductor layer provided on the light-emitting layer, wherein the second semiconductor layer is nitride-based and has a second conductivity type; and a strain relaxation layer provided between the first semiconductor layer and the light-emitting layer, and comprising an AlGaN layer having a protrusion whose horizontal cross-section area decreases as the protrusion extends in a vertical direction from the second semiconductor layer to the first semiconductor layer, wherein each of the first semiconductor layer and the second semiconductor layer comprises a GaN layer, wherein the light-emitting layer comprises a multi-quantum well (MQW) structure comprising a first plurality of InGaN layers, and wherein the strain relaxation layer comprises a superlattice buffer layer.

2. The nitride-based semiconductor light-emitting device of claim 1, wherein the first semiconductor layer comprises an n-type GaN layer, and the second semiconductor layer comprises a p-type GaN layer.

3. The nitride-based semiconductor light-emitting device of claim 1, wherein a first plurality of GaN layers are provided between the first plurality of InGaN layers.

4. The nitride-based semiconductor light-emitting device of claim 1, wherein the superlattice buffer layer comprises a structure including a second plurality of InGaN layers stacked alternatingly with a second plurality of GaN layers stacked alternately.

5. The nitride-based semiconductor light-emitting device of claim 1, wherein the AlGaN layer is provided in the superlattice buffer layer.

6. The nitride-based semiconductor light-emitting device of claim 5, wherein the AlGaN layer is located above a minimum thickness of the superlattice buffer layer at which strain relaxation occurs.

7. The nitride-based semiconductor light-emitting device of claim 5, wherein V-shaped pits generated in a strain relaxation process are formed at a location of the AlGaN layer in the superlattice buffer layer, and wherein the AlGaN layer is formed to fill the V-shaped pits.

8. The nitride-based semiconductor light-emitting device of claim 7, wherein the AlGaN layer is configured to suppress propagation of dislocations from the V-shaped pits toward the light-emitting layer.

9. The nitride-based semiconductor light-emitting device of claim 1, wherein the AlGaN layer is provided at least one of on the superlattice buffer layer and under the superlattice buffer layer.

10. The nitride-based semiconductor light-emitting device of claim 9, wherein the AlGaN layer is further provided in the superlattice buffer layer.

11. A display device comprising:

a display, wherein the display comprises:

a first semiconductor layer, wherein the first semiconductor layer is nitride-based and has a first conductivity type;

a light-emitting layer provided on the first semiconductor layer, wherein the light-emitting layer comprises a nitride-based semiconductor comprising Indium (In);

a second semiconductor layer provided on the light-emitting layer, wherein the second semiconductor layer is nitride-based and has a second conductivity type; and a strain relaxation layer provided between the first semiconductor layer and the light-emitting layer, and comprising an AlGaN layer having a protrusion whose horizontal cross-section area decreases as the protrusion extends in a vertical direction from the second semiconductor layer to the first semiconductor layer, wherein each of the first semiconductor layer and the second semiconductor layer comprises a GaN layer, wherein the light-emitting layer comprises a multi-quantum well (MQW) structure comprising a first plurality of InGaN layers, and wherein the strain relaxation layer comprises a superlattice buffer layer.

12. A nitride-based semiconductor light-emitting device comprising:

a first semiconductor layer, wherein the first semiconductor layer is nitride-based and has a first conductivity type;

a light-emitting layer provided on the first semiconductor layer, wherein the light-emitting layer comprises a nitride-based semiconductor comprising Indium (In);

a second semiconductor layer provided on the light-emitting layer, wherein the second semiconductor layer is nitride-based and has a second conductivity type; and a strain relaxation layer provided between the first semiconductor layer and the light-emitting layer, and comprising an AlGaN layer having a protrusion whose horizontal cross-section area decreases as the protrusion extends in a first vertical direction from the second semiconductor layer to the first semiconductor layer, and in a second vertical direction from the first semiconductor layer to the second semiconductor layer, wherein the light-emitting layer comprises a multi-quantum well (MQW) structure including a first plurality of InGaN layers stacked alternatingly with a first plurality of GaN layers, wherein the strain relaxation layer comprises a superlattice buffer layer.

13. The nitride-based semiconductor light-emitting device of claim 12, wherein each of the first semiconductor layer and the second semiconductor layer comprises a GaN layers.

14. The nitride-based semiconductor light-emitting device of claim 12, wherein the superlattice buffer layer comprises a structure including a second plurality of InGaN layers stacked alternatingly with a second plurality of GaN layers.

15. The nitride-based semiconductor light-emitting device of claim 12, wherein the AlGaN layer is provided in the superlattice buffer layer and is located above a minimum thickness of the superlattice buffer layer at which strain relaxation occurs.

16. A nitride-based semiconductor light-emitting device comprising:

a first semiconductor layer, wherein the first semiconductor layer is nitride-based and has a first conductivity type;

a light-emitting layer provided on the first semiconductor layer, wherein the light-emitting layer comprises a nitride-based semiconductor comprising Indium (In);

a second semiconductor layer provided on the light-emitting layer, wherein the second semiconductor layer is nitride-based and has a second conductivity type; and a strain relaxation layer provided between the first semiconductor layer and the light-emitting layer, wherein the strain relaxation layer comprises a superlattice buffer layer having a structure including a plurality of InGaN layers stacked alternatingly with a plurality of GaN layers stacked alternately, and an AlN layer and an AlGaN layer having a protrusion whose horizontal cross-section area decreases as the protrusion extends in a vertical direction from the second semiconductor layer to the first semiconductor layer.

17. The nitride-based semiconductor light-emitting device of claim 16, wherein the AlN layer and the AlGaN layer are provided in the superlattice buffer layer.

18. The nitride-based semiconductor light-emitting device of claim 16, wherein the AlN layer and the AlGaN layer are located above a minimum thickness of the superlattice buffer layer at which strain relaxation occurs.

19. A display device comprising:

a display, wherein the display comprises:

a first semiconductor layer, wherein the first semiconductor layer is nitride-based and has a first conductivity type;

a light-emitting layer provided on the first semiconductor layer, wherein the light-emitting layer comprises a nitride-based semiconductor comprising Indium (In);

a second semiconductor layer provided on the light-emitting layer, wherein the second semiconductor layer is nitride-based and has a second conductivity type; and a strain relaxation layer provided between the first semiconductor layer and the light-emitting layer, wherein the strain relaxation layer comprises a superlattice buffer layer having a structure including a plurality of InGaN layers stacked alternatingly with a plurality of GaN layers stacked alternately, and an AlN layer and an AlGaN layer having a protrusion whose horizontal cross-section area decreases as the protrusion extends in a vertical direction from the second semiconductor layer to the first semiconductor layer.

20. A nitride-based semiconductor light-emitting device comprising:

a first semiconductor layer, wherein the first semiconductor layer is nitride-based and has a first conductivity type;

a light-emitting layer provided on the first semiconductor layer, wherein the light-emitting layer comprises a nitride-based semiconductor comprising Indium (In);

a second semiconductor layer provided on the light-emitting layer, wherein the second semiconductor layer is nitride-based and has a second conductivity type; and a strain relaxation layer provided between the first semiconductor layer and the light-emitting layer, wherein the strain relaxation layer comprises a superlattice buffer layer having a structure including a plurality of InGaN layers stacked alternatingly with a plurality of GaN layers stacked alternately, and an AlN layer and an AlGaN layer having a protrusion whose horizontal cross-section area decreases as the protrusion extends in a first vertical direction from the second semiconductor layer to the first semiconductor layer, and in a second vertical direction from the first semiconductor layer to the second semiconductor layer.

* * * * *